United States Patent
Snevely

(10) Patent No.: US 7,020,586 B2
(45) Date of Patent: Mar. 28, 2006

(54) DESIGNING A DATA CENTER

(75) Inventor: Robert D. Snevely, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 869 days.

(21) Appl. No.: 10/023,919

(22) Filed: Dec. 17, 2001

(65) Prior Publication Data

US 2003/0115024 A1 Jun. 19, 2003

(51) Int. Cl.
*G06F 17/50* (2006.01)
(52) U.S. Cl. ............................. 703/1; 713/1
(58) Field of Classification Search ............... 703/1; 709/223, 224, 238; 713/1
See application file for complete search history.

(56) References Cited

U.S. PATENT DOCUMENTS 6,374,627 B1 * 4/2002 Schumacher et al. ...... 62/259.2
6,754,816 B1 * 6/2004 Layton et al. ............... 713/1
6,907,395 B1 * 6/2005 Hunt et al. ................ 703/21

* cited by examiner

*Primary Examiner*—Albert W. Paladini
(74) *Attorney, Agent, or Firm*—Park, Vaughan & Fleming LLP

(57) ABSTRACT

A system and method for designing a data center. For each unique piece of equipment (e.g., a specific type/model of computer server, storage array, communication device) that may be installed in a data center, or each unique configuration of a piece of equipment, an equipment unit (EU) is defined to describe the equipment requirements or characteristics regarding power, cooling, size, weight, connectivity and/or other factors. An interchangeable equipment unit (IEU) may be defined to reflect the worst-case requirements of multiple pieces of equipment that may be interchanged or substituted (e.g., two different storage arrays). The total requirements of a desired equipment layout are determined from the EUs, and may be compared to the capacities of the data center space regarding available power, cooling, physical size, weight restrictions, etc. If any requirements exceed a data center capacity, the equipment or layout may be altered or the data center may be restructured.

40 Claims, 5 Drawing Sheets

| Requirements | EU 200<br>Storage Array A | EU 210<br>Storage Array B | EU 220<br>Server A | IEU 250<br>(EU 200 or EU 210) |
|---|---|---|---|---|
| Power: | Two 30A 208V L6-30R outlets;<br>3812 watts consumed | Two 30A 208V L6-30R outlets;<br>4111 watts consumed | Four 30A 208V L6-30R outlets;<br>8488 watts consumed | Two 30A 208V L6-30R outlets;<br>4111 watts consumed |
| Cooling: | 13,040 BTUs/hr | 14,060 BTUs/hr | 29,030 BTUs/hr | 14,060 BTUs/hr |
| Weight: | 970 lbs. (440 Kg) | 780 lbs. (354 Kg) | 1,000 lbs. (454 Kg) | 970 lbs. (440 Kg) |
| Size: | 24" X 48" = 8 ft² | 24" X 48" = 8 ft² | 24" X 54" = 9 ft² | 24" X 48" = 8 ft² |
| Bandwidth: | 4 multi-mode fiber | 2 multi-mode fiber | 4 multi-mode fiber,<br>4 cat-5 copper | 4 multi-mode fiber |
| Functional Capacity: | 5.2 TB | 4.7 TB | 24 CPUs, 96GB RAM | 4.7 TB |

FIG. 2

| Requirements | 40<br>EU 220<br>Server A | 160<br>EU 200<br>Storage Array A | Total Requirements |
|---|---|---|---|
| Power: | 160 30A 208V L6-30R outlets;<br>339,520 watts consumed | 320 30A 208V L6-30R outlets;<br>609,920 watts consumed | 480 30A 208V L6-30R outlets;<br>949,440 watts consumed |
| Cooling: | 1,121,200 BTUs/hr | 2,086,400 BTUs/hr | 3,207,600 BTUs/hr |
| Weight: | 40,000 lbs. (18,160 Kg) | 124,800 lbs. (56,640 Kg) | 164,800 lbs. (74,800 Kg) |
| Size: | 9ft² x 40 = 360 ft² | 8ft² x 160 = 1,280 ft² | 1,640 ft² |
| Bandwidth: | 160 multi-mode fiber,<br>160 cat-5 copper | 320 multi-mode fiber | 480 multi-mode fiber<br>160 cat-5 copper |
| Functional Capacity: | 960 CPUs, 3.84TB RAM | 832TB | 960 CPUs, 3.84TB RAM,<br>832TB Disk Storage |

FIG. 3

DESIGNING A DATA CENTER

BACKGROUND

This invention relates to the design of a data center. More particularly, a system and methods are provided for facilitating the design of a data center based on requirements of equipment to be installed, and/or selecting a configuration of computer equipment to be installed in a data center based on the capacities of the data center.

The concept of a "data center," a room or space designed for the operation of computer equipment, arose with the development of mainframe computers. Early data centers were therefore tailored to the requirements of a monolithic computing entity, in terms of power, cooling, physical space and so on. A few pieces of auxiliary or peripheral equipment may have been included in an early data center, but the requirements of the mainframe computer dwarfed those of any collocated resources.

Because the operation of a data center was focused on a single (and rather large) entity, the design of a data center typically focused on one parameter or criterion—the amount of power needed to operate the mainframe computer. This parameter could be expressed in watts per square foot (watts/ft$^2$). From the power requirements, the size or capacity of the equipment needed to dissipate heat generated by the mainframe could be estimated. The power and cooling requirements of the data center could be assumed to be uniform over the entire space of the data center as long as they were based on the requirements of the mainframe.

However, this traditional method of designing a data center is woefully inadequate in dealing with the decentralized computing solutions of today's data centers. Present data centers host multiple computers, of varying capabilities and requirements, along with significant peripheral equipment (e.g., storage arrays). When the methodology used to design past data centers is applied to a data center today, the power requirements of the various equipment are combined to yield an overall power consumption. That measure is divided by the size of the data center to provide an antiquated and inaccurate estimate of power (and cooling) needed on a per-square foot basis.

More specifically, there are now tens or hundreds of separate computing entities in a data center (e.g., personal computers, servers, large capacity storage arrays). These entities have varying power (and other) requirements, and are unlikely to be evenly distributed in terms of those requirements. Therefore, the power requirement yielded by yesterday's yardstick, in terms of an average number of watts/ft$^2$, is insufficient.

Thus, there is a need for a system and method for designing a data center for equipment having various capacities and requirements, wherein the individual requirements of each piece of equipment are adequately considered. In addition, because of the diverse nature of the equipment, requirements other than their power needs should be considered.

Yet further, there is a need for a system and method of tailoring the composition of equipment installed in a data center to the capacities of the data center. For example, when an existing space is to be converted into a data center or the equipment installed in an existing data center is to be replaced, the capacities of the data center (e.g., available power and cooling, physical size, weight limitations) should be considered when selecting the new equipment to be installed.

SUMMARY

Therefore, in one embodiment of the invention a system and methods are provided for designing or configuring a data center. The design or configuration of a data center may address the design of the data center itself (e.g., architecture, construction, remodeling) and/or the configuration of the equipment to be installed (e.g., the type or models of equipment, equipment configurations, equipment layout).

In this embodiment, for each type, model and/or configuration of computing equipment that may be installed (e.g., server, storage array, communication device), a corresponding equipment unit is defined to describe one or more characteristics of the individual piece of equipment. Such characteristics may include power and/or cooling requirements, the size of the equipment, its weight, its data connectivity, etc. The characteristics may also include a functional capability of the equipment (e.g., number of processors, computational speed, amount of storage space).

From the set of selected computing equipment, a first equipment plan is selected (e.g., how many pieces of each type/model of equipment, their configurations). The total characteristics or requirements of the first plan are calculated.

If the total requirements exceed the capacities of the data center (e.g., in terms of required power, cooling, size, etc.), the data center may be re-designed (e.g., if not yet built) or remodeled to increase the data center's capacities. Or, a second plan of computing equipment (e.g., different components, different configurations) may be generated. The equipment plan and/or physical data center may be modified repeatedly until the data center can accommodate the equipment.

DESCRIPTION OF THE FIGURES

FIG. 2 demonstrates equipment units and an interchangeable equipment unit in accordance with an embodiment of the invention.

FIG. 3 depicts an illustrative equipment configuration generated from the EUs of FIG. 2, in accordance with an embodiment of the present invention.

DETAILED DESCRIPTION

Figure 1:
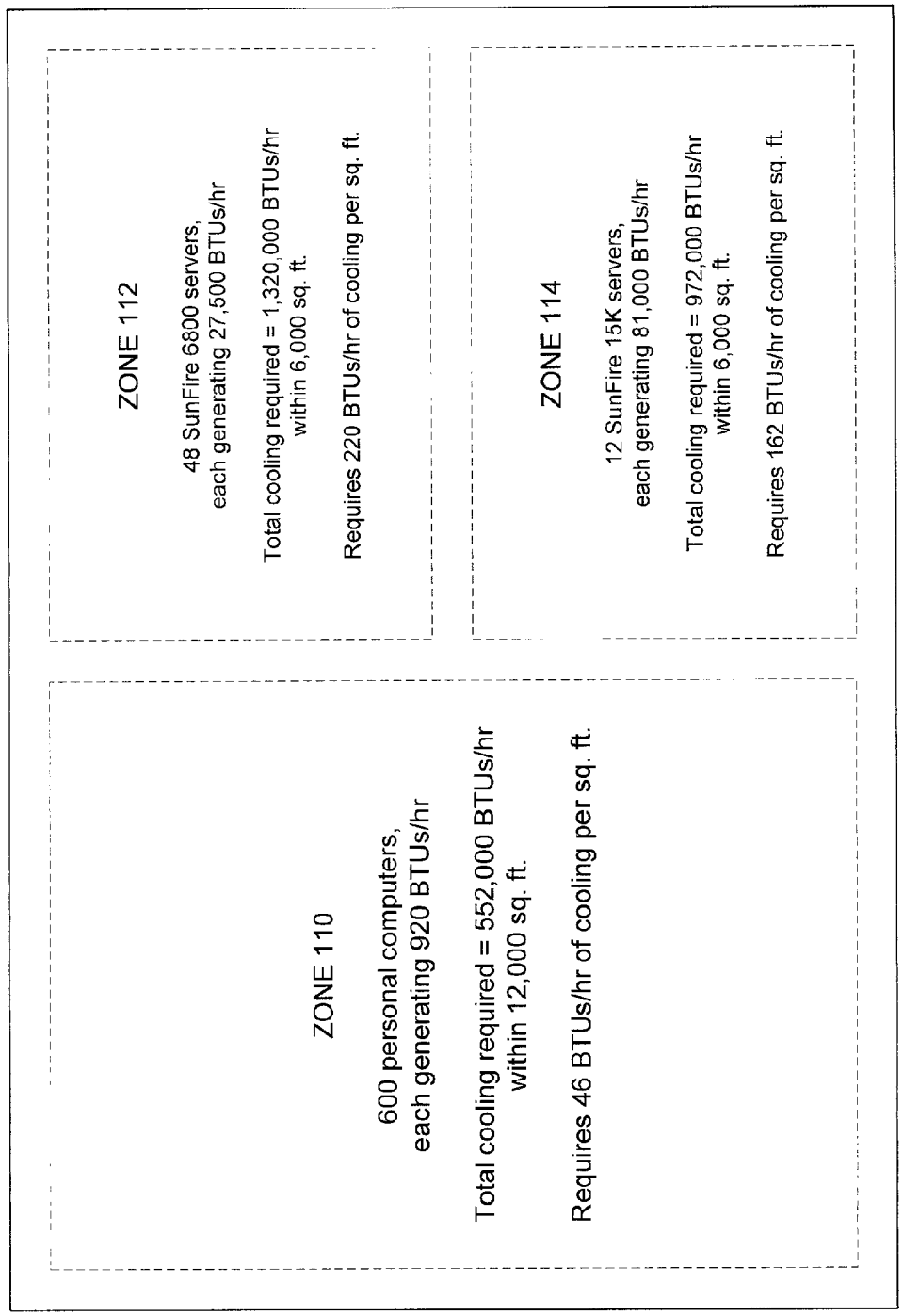
FIG. 1 is a block diagram depicting an illustrative data center.

The following description is presented to enable any person skilled in the art to make and use the invention, and is provided in the context of particular applications of the invention and their requirements. Various modifications to the disclosed embodiments will be readily apparent to those skilled in the art and the general principles defined herein may be applied to other embodiments and applications without departing from the scope of the present invention. Thus, the present invention is not intended to be limited to the embodiments shown, but is to be accorded the widest scope consistent with the principles and features disclosed herein.

The program environment in which a present embodiment of the invention is executed illustratively incorporates a general-purpose computer or a special purpose device such as a hand-held computer. Details of such devices (e.g., processor, memory, data storage, display) may be omitted for the sake of clarity.

It should also be understood that the techniques of the present invention might be implemented using a variety of technologies. For example, the methods described herein may be implemented in software executing on a computer system, or implemented in hardware utilizing either a combination of microprocessors or other specially designed application specific integrated circuits, programmable logic devices, or various combinations thereof. In particular, methods described herein may be implemented by a series of computer-executable instructions residing on a suitable computer-readable medium. Suitable computer-readable media may include volatile (e.g., RAM) and/or nonvolatile (e.g., ROM, disk) memory, carrier waves and transmission media (e.g., copper wire, coaxial cable, fiber optic media). Exemplary carrier waves may take the form of electrical, electromagnetic or optical signals conveying digital data streams along a local network, a publicly accessible network such as the Internet or some other communication link.

In one embodiment of the invention, a system and method are provided for designing a data center in light of various requirements of equipment to be installed in the data center. In another embodiment, a method is provided for selecting equipment to be installed in a data center based on various capacities of the data center. In yet another embodiment of the invention, the design of a data center and the selection of equipment to be installed in the data center may be interleaved. In this embodiment, the determination of a particular equipment requirement affects an aspect of the data center and the determination of a particular capacity or limitation of the data center affects the selection of equipment.

The requirements of computing and peripheral equipment that may affect the design of a data center may include criteria such as: power, cooling, size, weight, connectivity, functional capability, etc. The relevant capacities of a data center may be similar and are further described below, following discussions of the individual equipment requirements.

Equipment power requirements may be measured in watts, voltage, current, amperage, single-phase vs. three-phase and/or other suitable units. The availability of redundant power (e.g., in an equipment rack) may also be noted, as this will affect the amount of power that the data center equipment will consume.

Equipment cooling requirements may be measured in terms of the BTUs (British Thermal Units) generated per hour. If not specifically identified for a piece of equipment, the BTUs generated by the equipment each hour that it operates may be approximated by multiplying the power it consumes (in watts) by the value 3.42 (i.e., BTUs per hour=watts×3.42).

The size of a piece of data center equipment may be measured in inches, feet or other usable units. The measure of equipment size may include any additional space required to allow for air circulation, or this may be considered separately. Also, free space needed within the data center for aisles, ramps, work space or other needs may be considered separately or may be combined with individual equipment sizes. Illustratively, approximately forty to fifty percent of the total two-dimensional size of a data center may be "free space."

Equipment weight, which may be measured in pounds, kilograms, or other suitable units, may reflect the installation weight of the equipment (e.g., including a rack or cabinet in which it is installed).

Illustratively, the connectivity of a piece of data center equipment may be measured in terms of the types and number of interconnections required with other equipment or resources. Thus, a connectivity requirement may specify that four multi-mode optical fiber cables or six category 5 copper cables are required to operate the equipment as needed.

Functional capability may reflect the amount of storage space provided by a storage array, the processing capacity of a server, or other benefit. Illustratively, the functional capability of a particular type of equipment may be used to determine how many units of that equipment are needed.

The data center capacities corresponding to the preceding equipment requirements may include: power in-feed, cooling capacity, size of the data center, maximum floor load, available bandwidth, etc. As described above, data center capacities may be designed according to the equipment to be installed, or may serve as limitations to the equipment that can be installed in an existing space.

The power in-feed of a data center may be expressed in terms of the number of breakers, number/location of outlets, the ratings or capacities of the power circuits, etc. For example, the power in-feed of a particular data center may be defined as 150 30-amp circuits.

For an existing data center, the capacity of the existing HVAC (Heating, Ventilation and Air Conditioning) system should be known, and may be expressed as a measure of the number of BTUs of heat that can be cooled per hour. The efficiency of the cooling system must also be considered. For example, if the HVAC system can cool 10,000 BTUs per hour with ninety percent efficiency, then the cooling needs of the equipment to be installed should not exceed 9,000 BTUs per hour.

The size of an existing data center will limit the amount/type of equipment that can be installed. For example, free space must be reserved for room between racks of equipment, for foot traffic, and so on.

In terms of weight, if the individual or total weight of equipment to be installed is high, then the structural capacity of the floor of the data center must be considered. Because many data centers include raised floors to facilitate air circulation, the capacities of the raised floor and the subfloor may need to be considered. For example, if the data center occupies an upper floor of a building rather than a ground floor, it may support less weight. For raised flooring, the load that can be supported must be considered, which may be less for perforated or slotted tiles than for solid tiles. In addition, if a data center will be designed with stronger flooring in one area than another, the stronger area should be located near the equipment egress, so that such equipment is not transported across the weaker flooring.

The bandwidth or connectivity capacity of a data center may relate to the connectivity available to the outside world. Data center bandwidth capacity may thus indicate how much bandwidth is available for traffic to/from the Internet, other corporate networks, and so on.

FIG. 1 depicts an illustrative data center, populated with a variety of equipment having different requirements. In particular, data center 100 may be considered to encompass three zones-zones 110, 112, 114-each of which contains different types of equipment.

Thus, zone 110 comprises a number of personal computers, each of which has relatively low cooling requirements.

Zone 112 comprises a first type of server that generates more heat than the personal computers of zone 110. Finally, zone 114 comprises several upper-tier servers having relatively high cooling requirements.

In the traditional method of designing data center 100, the total cooling requirements of all the equipment would be calculated: 552,000+1,320,000+972,000=2,844,000 BTUs/hr. Dividing this by the size of the data center (24,000 ft$^2$) yields a value of 118.50 BTUs/hr/ft$^2$. While this amount of cooling would be more than sufficient for the personal computers of zone 110, the Sun Fire™ servers of zones 112, 114 would not receive sufficient cooling.

Therefore, in one embodiment of the invention, a method is provided for designing a data center in which equipment requirements and data center capacities may be balanced. Thus, if a particular data center capacity (e.g., power in-feed, cooling) is a limiting factor, then the selection of equipment to be installed may be adjusted accordingly. Similarly, if a particular configuration of equipment is essential to operation of the data center, the data center can be designed to meet that requirement.

In this embodiment, an equipment unit (EU) is defined to represent a specific equipment configuration in terms of some or all of the equipment requirements described above. An EU may comprise a profile, list or table of requirements and, as described below, serve as a proxy when designing or configuring a data center.

Thus, a particular EU may describe the power, cooling, physical space, weight and connectivity requirements of a particular piece or type of equipment, and may report the equipment's functional capability. Each different type or configuration of equipment may be reflected in a separate EU.

When a particular EU is defined, the total power, cooling and other requirements for supporting any number of identically configured pieces of equipment may be easily determined. Or, if it is determined that a data center has only limited capacity in one or more areas (e.g., cooling), the maximum number of EUs that can be supported may be readily calculated.

FIG. 2 depicts illustrative EUs for three different types of equipment. EU 200 represents a first storage array (Storage Array A); EU 210 represents a second storage array (Storage Array B); EU 220 describes a server that is compatible with either of storage arrays A and B. By constructing the EUs of FIG. 2, the data center designer can quickly determine where the associated equipment can, or cannot, be located. Thus, the location or density of available power outlets, the pattern of air circulation or other factors may affect where a particular piece of equipment may or may not be placed.

An EU may reflect a piece of equipment as mounted in a rack or other enclosure, or may reflect a bare (e.g., uninstalled) unit. An EU may also include, in its size requirements, any necessary or desired free space or cooling space around the equipment or rack.

Illustratively, in FIG. 2 the indicated requirements in each EU relate to a single storage array or server, which may be mounted in a rack. However, another EU may be defined to describe the requirements for supporting an enclosure in which multiple pieces of equipment are installed. The equipment may be of the same or different types.

Further, the configuration of a piece of equipment reflected in an EU may represent just one possible configuration. For example, although Storage Array A of EU 200 specifies the (maximum) use of four multi-mode fiber connections, if it is determined that fewer connections (e.g., two) will be sufficient, the EU may be changed accordingly. If both configurations are desired, separate EUs may be defined.

In one embodiment of the invention, when different EUs are defined for different configurations of the same type/piece of equipment, or for two pieces of equipment that could be used for the same general purpose (e.g., storage, processing), an interchangeable equipment unit, or IEU, may be defined.

In this embodiment, an IEU reports requirements that, if satisfied, will allow the equipment reflected in either of two or more EUs to be installed. FIG. 2 demonstrates an illustrative IEU 250, in which EU 200 and EU 210 are interchangeable. IEU reports the worst-case value for each requirement (and functional capability). IEUs may be particularly useful when a data center is limited in regard to one or more capacities, and the designer needs flexibility in determining what types of equipment, and how many units of each, to install. An IEU may be defined to cover any number of "interchangeable" pieces of equipment.

After the appropriate EUs and IEUs are constructed for equipment that will, or may, be installed in a data center, various combinations of the equipment may be possible. If the data center is a new space, then it can be designed and constructed to fit an optimum or desired configuration of equipment. Alternatively, if equipment is being selected for an existing data center, which therefore has certain limitations regarding power, cooling and so on, various configurations of equipment can be considered, via their EUs.

For example, suppose it is desired to place forty instances of Server A in a data center, with each server being connected to four storage arrays. FIG. 3 reflects the total requirements, for each EU and the overall requirements that must be met, in terms of data center capacities, to accommodate the desired equipment.

Various alterations may be made to the requirements generated in this manner. For example, and as discussed above, if it desired to have half of the data center open (e.g., free space), then the size requirement in FIG. 3 would be multiplied by two to yield a total of 3,280 ft$^2$.

If the capacities of the data center cannot accommodate the total requirements of the desired equipment, then the equipment mix, as represented by EUs may be adjusted accordingly. Thus, if it turns out that only 450 30A 208V circuits will be available, the number of EU 220 units may be decreased by three, which decreases the number of EU 200 units by twelve. The resulting configuration requires only 444 circuits. Similar reductions are made to the required cooling, physical space, weight and connectivity requirements.

Methods of designing or configuring a data center as described herein may be performed on a variety of computing devices, from hand-held devices (e.g., PDA) to personal computers, servers, etc. Such devices may be configured with appropriate software, hardware and/or firmware for receiving a data center's capacities and requirements or characteristics of a piece of computing equipment that may be installed in the data center.

The device will also be configured to facilitate the aggregation or combination of the requirements of individual equipment items or components to yield the total requirements for a particular equipment plan or layout. Finally, the device will facilitate comparison of the total requirements with any known capacities of the data center and enable an equipment plan to be modified (or the data center to be re-designed) if the data center cannot accommodate the plan requirements.

Figure 4:
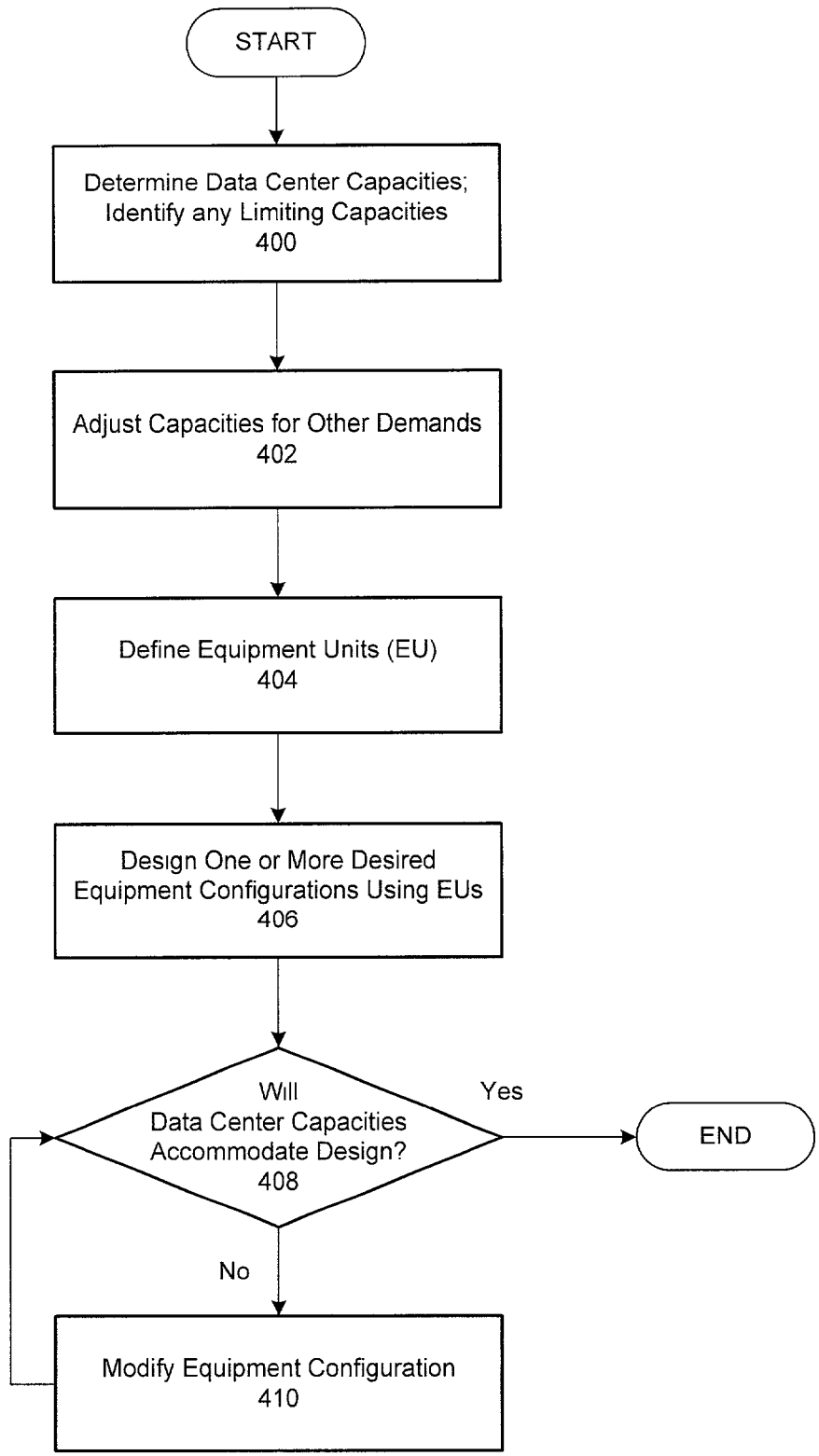
FIG. 4 is a flowchart illustrating one method of designing an equipment configuration to meet one or more limiting data center capacities, in accordance with an embodiment of the present invention.

FIG. 4 demonstrates one method of designing the configuration of a data center based on the data center's capacities, according to one embodiment of the invention.

In state 400, one or more capacities of the data center are determined. In the illustrated method, one or more data center capacities are fixed or not easily altered. For example, the power in-feed to the data center or the cooling capacity may be set. There will likely be a predetermined, or maximum, size for the data center, and/or there may be a structural limit to the amount of weight the floor of the data center can support. Not all data center capacities need to be known; others can be left for later determination, may be approximated or may be of little concern. For example, if the data center is located on the ground floor, and the amount of heavy equipment to be installed is relatively minor, then the load-bearing ability of the floor is unlikely to be a concern and may therefore be approximated.

In state 402, any known demands on the data center capacities—other than the computing equipment to be installed—may be subtracted from the capacities. Illustratively, if the total power in-feed and cooling capacity are known, then the power needed to operate the HVAC system may be deducted from the total power in-feed. The remaining power will be considered the data center capacity for the computing equipment.

In state 404, equipment units (EU) are defined for the various equipment that will or may be installed. As described above, each piece of equipment having a particular configuration may be reflected in a separate EU. Or, one EU may be defined for all equipment of the same type or model, regardless of configuration. In this case, the requirements listed in the EU may reflect the worst-case requirements. Further, any number of interchangeable EUs, or IEUs, may be defined to cover interchangeable equipment (e.g., different models of storage arrays, different computer servers).

Generating an EU may entail contacting an equipment vendor or manufacturer to determine a particular requirement. As with the data center capacities, one or more equipment requirements may be left unspecified if they cannot be determined or are unlikely to limit the data center design. For example, if the data center is far larger than is needed (e.g., older, large, computing equipment is being replaced with just a few, small machines), then the physical size of the equipment may be determined later.

In state 406, the EUs are employed to select a desired or optimal configuration of equipment for the data center. Multiple configurations may be generated in case a first choice cannot be accommodated.

In state 408 the total equipment requirements of a desired design are compared to the data center capacities. If the capacities are sufficient, the illustrated method ends. Otherwise, in state 410 the design is reworked to alter the mix of EUs and/or IEUs. Until a design is reached that can be accommodated, states 408 and 410 are revisited as necessary.

Figure 5:
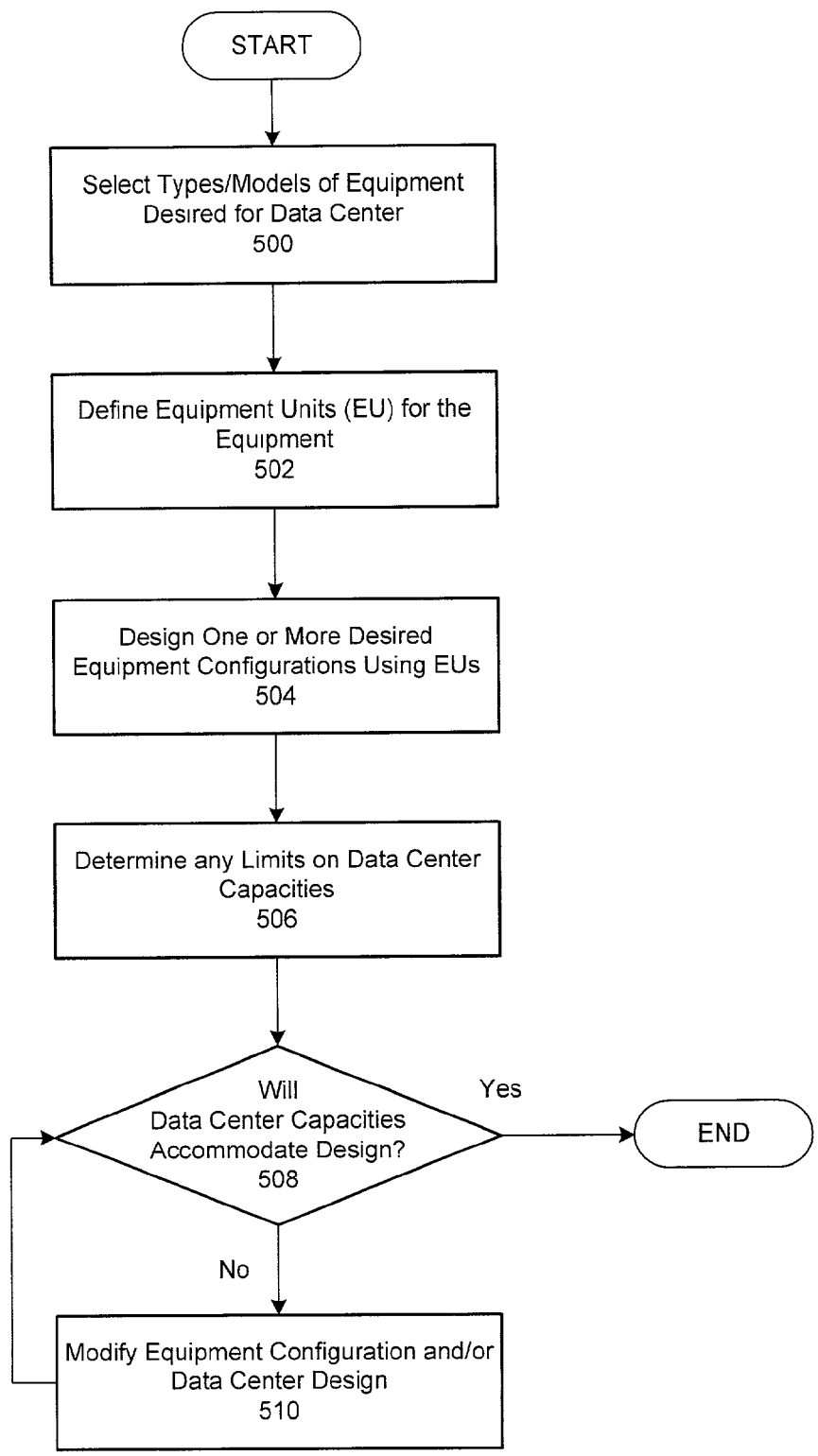
FIG. 5 is a flowchart illustrating one method of designing a data center to accommodate a desired equipment configuration, in accordance with an embodiment of the invention.

FIG. 5 demonstrates one method of designing a new data center or remodeling an existing one, according to one embodiment of the invention.

In state 500, equipment that is desired for the data center is selected—such as specific models and configurations of servers, storage arrays, communication networks, cabling, etc.

In state 502, EUs are defined for each piece of equipment of concern. Some equipment may not be reflected in the EUs at all (e.g., lighting, facsimile machine), while EUs for other equipment (e.g., modems, fiber-optic cable) may not reflect all the criteria described above. IEUs may be defined as desired, especially where multiple types, models or configurations of particular equipment may be substituted for each other.

In state 504, one or more configurations of equipment are assembled using the EUs. A first-choice may be generated as well as one or more backup plans.

In state 506, any possible limitations that may be imposed by the data center capacities, or the building in which it is located, may be determined. For example, if a desired plans calls for the installation of several very heavy pieces of equipment in the data center, the weight tolerances of a raised floor or subfloor may be ascertained. Or, it may be determined if there are any limitations on the amount of power or cooling that can be provided.

In state 508, the desired configuration of equipment is compared against any limiting data center capacities. If the capacities can accommodate the desired configuration, the method ends. Otherwise, in state 510 the configuration is modified and the method returns to state 508.

The foregoing descriptions of embodiments of the invention have been presented for purposes of illustration and description only. They are not intended to be exhaustive or to limit the invention to the forms disclosed. Accordingly, the above disclosure is not intended to limit the invention; the scope of the invention is defined by the appended claims.

What is claimed is:

1. A method of configuring a data center, wherein the data center has associated capacities for hosting the operation of computing equipment, the method comprising:

for each computing mechanism in a set of computing mechanisms, defining a corresponding equipment unit describing one or more characteristics of said computing mechanism;

aggregating said characteristics described in said equipment units corresponding to a selected subset of said computing mechanisms; and determining whether the capacities of the data center can accommodate said aggregated characteristics.

2. The method of claim 1, further comprising:

if the associated capacities of the data center cannot accommodate said aggregated characteristics, modifying said selected subset of said computing mechanisms.

3. The method of claim 1, further comprising:

if the associated capacities of the data center cannot accommodate said aggregated characteristics, re-designing the data center to increase one or more of the associated capacities.

4. The method of claim 1, wherein said defining an equipment unit comprises:

defining an interchangeable equipment unit comprising selected characteristics of two or more substitutable computing mechanisms.

5. The method of claim 1, wherein the associated capacities of the data center include one or more of: electrical power and cooling.

6. The method of claim 1, wherein the associated capacities of the data center include one or more of: electrical power, cooling and physical space.

7. The method of claim 1, wherein the associated capacities of the data center include one or more of: electrical power, cooling, physical space and weight.

8. The method of claim 1, wherein the associated capacities of the data center include one or more of: electrical power, cooling, physical space, weight and data connectivity.

9. The method of claim 1, wherein said characteristics described in an equipment unit for a corresponding computing mechanism include one or more of:
   electrical power requirement for operating said computing mechanism; and
   cooling requirement for operating said computing mechanism.

10. The method of claim 9, wherein said characteristics further include a measure of physical space required for situating said computing mechanism in the data center.

11. The method of claim 9, wherein said characteristics further include a weight of said computing mechanism.

12. The method of claim 9, wherein said characteristics further include a connectivity requirement of said computing mechanism.

13. The method of claim 9, wherein said characteristics further include a functional capability of said computing mechanism.

14. The method of claim 1, wherein said computing mechanisms include one or more computer servers.

15. The method of claim 14, wherein said computing mechanisms further include one or more storage devices.

16. The method of claim 14, wherein said computing mechanisms further include one or more communication devices.

17. A computer readable storage medium storing instructions that, when executed by a computer, cause the computer to perform a method of configuring a data center, wherein the data center has associated capacities for hosting the operation of computing equipment, the method comprising:
   for each computing mechanism in a set of computing mechanisms, defining a corresponding equipment unit describing one or more characteristics of said computing mechanism;
   aggregating said characteristics described in said equipment units corresponding to a selected subset of said computing mechanisms; and
   determining whether the capacities of the data center can accommodate said aggregated characteristics.

18. A method of configuring a computer equipment operating area, comprising:
   identifying one or more limiting capacities of the computer operating area;
   creating, for each computing equipment item in a set of computing equipment items, a profile comprising one or more characteristics of said computing equipment item;
   selecting a first subset of said computing equipment items for possible installation in the computer operating area;
   combining said characteristics from said profiles corresponding to said first subset of said computing equipment items; and
   if said combined characteristics exceed said limiting capacities, selecting a second subset of said computing equipment items.

19. The method of claim 18, further comprising:
   for two or more of said computing equipment items that are functionally interchangeable, creating an interchangeable profile comprising characteristics encompassing either of said two or more computing equipment items.

20. The method of claim 18, wherein said limiting capacities include one or more of: electrical power, cooling and physical space.

21. The method of claim 18, wherein said limiting capacities include one or more of: electrical power, cooling, physical space, weight and data connectivity.

22. The method of claim 18, wherein a first profile corresponding to a first computer equipment item describes one or more of the following characteristics of said first computer equipment item:
   an electrical power requirement for operating said first computer equipment item; and
   a cooling requirement for operating said first computer equipment item.

23. The method of claim 22, wherein said first profile further describes one or more of the following characteristics of said first computer equipment item:
   a size of said first computer equipment item;
   a weight of said first computer equipment item; and
   a data connectivity of said first computer equipment item.

24. The method of claim 22, wherein said first profile further describes a functional capability of said first computer equipment item.

25. The method of claim 18, wherein said computing equipment items include one or more computers and one or more storage devices.

26. The method of claim 25, wherein said computing equipment items further include one or more communication devices.

27. A method of designing a data center for operating computer equipment, comprising:
   (a) defining a proxy for each member of a set of computer equipment, wherein said proxy describes requirements of said member, including:
      (i) a power requirement for operating said member;
      (ii) a cooling requirement for operating said member; and
      (iii) a physical space requirement for said member;
   (b) combining said proxy requirements for each member of a first subset of said computer equipment; and
   (c) determining whether the data center can accommodate said combined proxy requirements.

28. The method of claim 27, further comprising:
   (d) if the data center cannot accommodate said combined proxy requirements, repeating said (b) and (c) for a second subset of said computer equipment.

29. The method of claim 27, wherein said proxy further describes:
   (iv) a connectivity requirement for operating said member.

30. The method of claim 27, wherein said proxy further describes:
   (iv) a weight of said member.

31. The method of claim 27, wherein said proxy further describes:
   (iv) a functional capability of said member.

32. The method of claim 27, wherein said determining comprises:
   (c') if the data center comprises an existing structure, determining whether the data center has a limited capacity for:
      (i) providing power for operating the computer equipment;
      (ii) cooling the computer equipment; and
      (iii) providing space for the computer equipment.

33. The method of claim 32, wherein said determining further comprises determining whether the data center has a limited capacity for:
   (vi) supporting the weight of the computer equipment; and
   (v) providing data connectivity required by the computer equipment.

34. The method of claim 27, wherein said determining comprises:
  (c') determining whether the data center can be structured to provide sufficient:
    (i) power;
    (ii) cooling; and
    (iii) space
  to accommodate said combined proxy requirements.

35. The method of claim 34, wherein said determining further comprises determining whether the data center can be structured to provide sufficient:
  (iv) load-bearing capacity; and
  (v) data connectivity to accommodate said combined proxy requirements.

36. A computer readable storage medium storing instructions that, when executed by a computer, cause the computer to perform a method of designing a data center for operating computer equipment, the method comprising:
  (a) defining a proxy for each member of a set of computer equipment, wherein said proxy describes requirements of said member, including:
    (i) a power requirement for operating said member;
    (ii) a cooling requirement for operating said member; and
    (iii) a physical space requirement for said member;
  (b) combining said proxy requirements for each member of a first subset of said computer equipment; and
  (c) determining whether the data center can accommodate said combined proxy requirements.

37. A system for configuring a data center, comprising:
  a first input module configured to receive a set of capacities of the data center;
  a second input module configured to receive requirements relating to each item in a set of computer equipment;
  a profiler configured to generate a total of said requirements for a first subset of said computer equipment; and
  a comparator configured to compare said total requirements with said data center capacities.

38. The system of claim 37, wherein said profiler is further configured to generate a total of said requirements for a second subset of said computer equipment if said total requirements for said first subset of computer equipment exceed said data center capacities.

39. The system of claim 37, wherein said profiler is configured to generate a first profile encompassing said requirements for a first computer equipment item.

40. The system of claim 39, wherein said profiler is further configured to generate a first interchangeable profile encompassing either of said first computer equipment item and a second computer equipment item;
  wherein said first computer equipment item and said second computer equipment item are functionally substitutable.

* * * * *